(12) United States Patent
Sanderovich et al.

(10) Patent No.: US 10,958,287 B1
(45) Date of Patent: Mar. 23, 2021

(54) EFFICIENT COMPRESSION OF RADAR DATA

(71) Applicant: QUALCOMM Incorporated, San Diego, CA (US)

(72) Inventors: Amichai Sanderovich, Atlit (IL); Ran Hay, Rosh Haaein (IL); Eran Hof, Haifa (IL); Evyatar Hemo, Kiryat Bialik (IL); Evgeny Levitan, Haifa (IL); Liat Rahmani Kochavi, Binyamina (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/918,587

(22) Filed: Jul. 1, 2020

(30) Foreign Application Priority Data

Dec. 3, 2019 (IL) .......................................... 271140

(51) Int. Cl.
*H03M 7/30* (2006.01)
*G06F 9/38* (2018.01)
*G06F 17/18* (2006.01)

(52) U.S. Cl.
CPC ......... *H03M 7/6011* (2013.01); *G06F 9/3885* (2013.01); *G06F 17/18* (2013.01); *H03M 7/70* (2013.01)

(58) Field of Classification Search
CPC ....... H03M 7/6011; H03M 7/70; G06F 17/18; G06F 9/3885
USPC ....................................................... 341/50, 87
See application file for complete search history.

(56) References Cited

U.S. PATENT DOCUMENTS

2017/0054449 A1* 2/2017 Mani .................... H03M 7/4075
2019/0317205 A1* 10/2019 Meissner ................ G01S 13/34

\* cited by examiner

*Primary Examiner* — Khai M Nguyen
(74) *Attorney, Agent, or Firm* — Thien T. Nguyen

(57) ABSTRACT

A two-stage technique for compressing radar data is disclosed in which, in the first stage, Constant False Alarm Rate (CFAR) compression is conducted using a median calculated from at least one dimension of radar data, which is then used to determine filtering threshold values for all dimensions of the radar data. The radar data is then compressed by filtering the radar data based on the filtering threshold values. In the second stage, peak detection is then performed on the compressed data to identify detected objects (targets). These and other embodiments are described herein.

30 Claims, 12 Drawing Sheets

EFFICIENT COMPRESSION OF RADAR DATA

RELATED APPLICATIONS

This application claims the benefit of Israel Application No. 271140, filed Dec. 3, 2019, entitled "EFFICIENT COMPRESSION OF RADAR DATA," which is assigned to the assignee hereof, and incorporated herein in its entirety by reference.

BACKGROUND

Radar uses Radio Frequency (RF) signals to determine the location and/or movement of an object. Traditionally, "ping" radar (low-resolution radar) has been used in air defense systems, flight control systems, and many other applications. More recently, however, "imaging" radar (high-resolution radar) has provided a much higher-resolution image than ping radar can provide. The higher resolution provided by imaging radar can be used for object detection in automotive and other applications.

Throughput and memory demands for imaging radar, however, can be quite demanding. Constant False Alarm Rate (CFAR) or peak detection can be used, but traditional techniques can require a high degree of complexity and may have insufficient capabilities to process radar data from high-resolution imaging radar systems. Moreover, alternative techniques may be insufficiently accurate for automotive and/or other modern applications.

BRIEF SUMMARY

Techniques described herein address these and other issues by utilizing a two-stage approach. In the first stage, CFAR compression is conducted using a median calculated from at least one dimension of radar data, which is then used to determine filtering threshold values for all dimensions of the radar data. The radar data is then compressed by filtering the radar data based on the filtering threshold values. In the second stage, peak detection is then performed on the compressed data to identify detected objects (targets). These and other embodiments are described herein.

An example method, according to this description, comprises obtaining input samples comprising values measured by a radar for a plurality of dimensions, determining a median of the values of the input samples for at least one dimension of the plurality of dimensions, and filtering the input samples based on the median to create a set of compressed radar data. The filtering comprises, for each dimension of the plurality of dimensions: determining a filtering threshold value for the respective dimension, and excluding, from the set of compressed radar data, one or more values of the input samples for the respective dimension that are less than the filtering threshold value above the median. The method further comprises performing peak detection on the set of compressed radar data to generate a list of one or more identified targets.

An example device for compressing radar data, according to this description, comprises a memory and one or more processing units communicatively coupled with the memory. The one or more processing units are configured to obtain input samples comprising values measured by a radar for a plurality of dimensions, determine a median of the values of the input samples for at least one dimension of the plurality of dimensions, and filter the input samples based on the median to create a set of compressed radar data. The filtering comprises, for each dimension of the plurality of dimensions: determining a filtering threshold value for the respective dimension, and excluding, from the set of compressed radar data, one or more values of the input samples for the respective dimension that are less than the filtering threshold value above the median. The one or more processing units are also configured to perform peak detection on the set of compressed radar data to generate a list of one or more identified targets.

Another example device according to this description, comprises means for obtaining input samples comprising values measured by a radar for a plurality of dimensions, means for determining a median of the values of the input samples for at least one dimension of the plurality of dimensions, means for filtering the input samples based on the median to create a set of compressed radar data. The filtering comprises, for each dimension of the plurality of dimensions determining a filtering threshold value for the respective dimension and excluding, from the set of compressed radar data, one or more values of the input samples for the respective dimension that are less than the filtering threshold value above the median. The device further comprises means for performing peak detection on the set of compressed radar data to generate a list of one or more identified targets.

An example non-transitory computer-readable medium, according to this description, has instructions embedded therewith for compressing radar data. The instructions, when executed by one or more processing units, cause the one or more processing units to perform one or more operations comprising obtaining input samples comprising values measured by a radar for a plurality of dimensions, determining a median of the values of the input samples for at least one dimension of the plurality of dimensions, and filtering the input samples based on the median to create a set of compressed radar data. The filtering comprises, for each dimension of the plurality of dimensions, determining a filtering threshold value for the respective dimension, and excluding, from the set of compressed radar data, one or more values of the input samples for the respective dimension that are less than the filtering threshold value above the median. The instructions, when executed by one or more processing units, further cause the one or more processing units to perform one or more operations comprising performing peak detection on the set of compressed radar data to generate a list of one or more identified targets.

Figure 1:
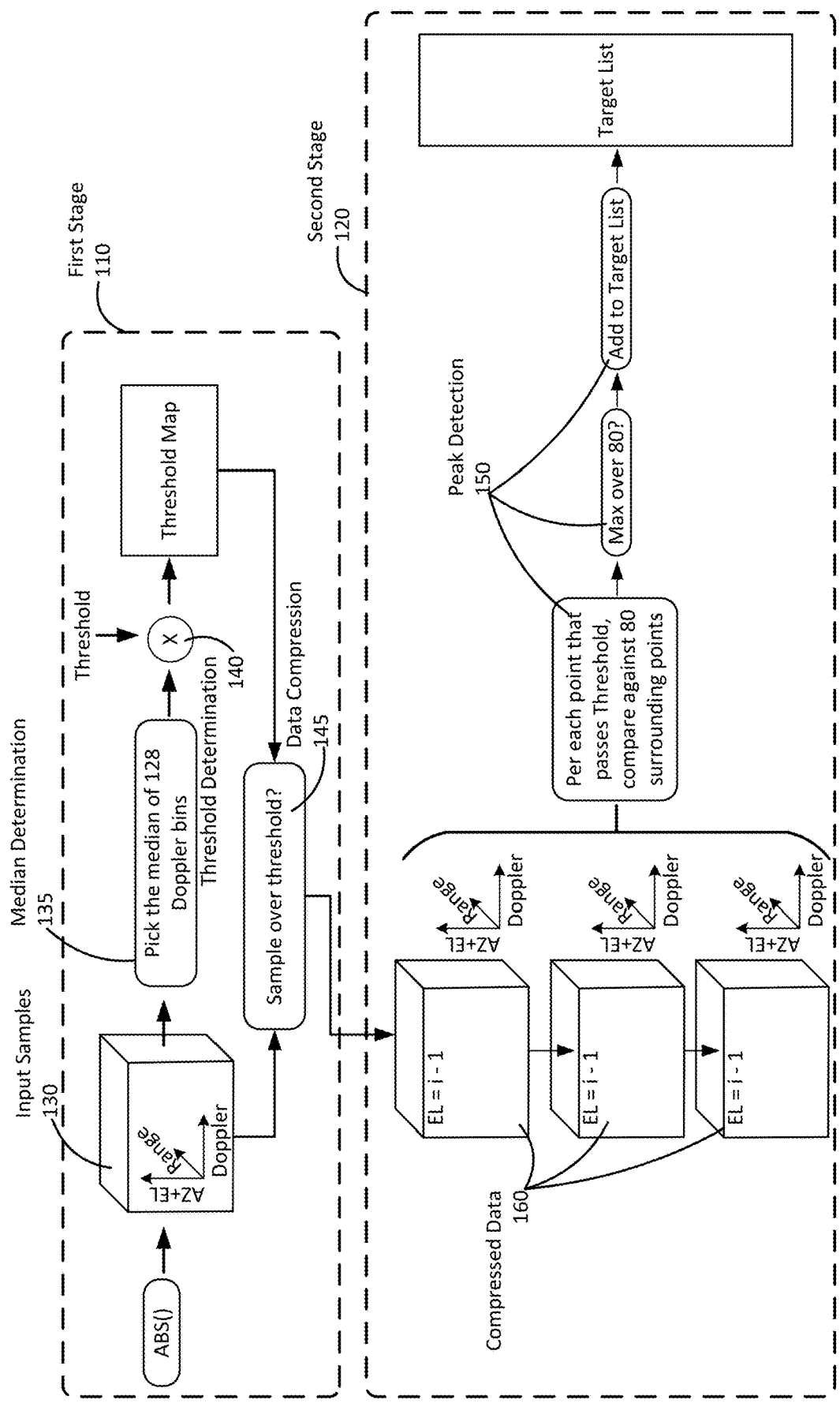
FIG. 1 is a block diagram illustrating an embodiment of a technique for compressing radar data.

Like reference symbols in the various drawings indicate like elements, in accordance with certain example implementations. In addition, multiple instances of an element may be indicated by following a first number for the element with a letter or a hyphen and a second number. For example, multiple instances of an element 110 may be indicated as 110-1, 110-2, 110-3 etc. or as 110a, 110b, 110c, etc. When referring to such an element using only the first number, any instance of the element is to be understood (e.g., element 110 in the previous example would refer to elements 110-1, 110-2, and 110-3 or to elements 110a, 110b, and 110c).

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

Imaging radar can be used in modern electronic devices and systems for a variety of industrial, commercial, military, and consumer applications. In particular, radar utilizing RF frequencies with relatively small wavelengths (e.g., on the order of centimeters or millimeters, such as millimeter wave ("mmWave") radar) can be used for applications such as imaging for automated driving, object detection, and more. In these applications, radar systems may which typically operate at 57-71 GHz, but may include frequencies ranging from 30-300 GHz. In some embodiments, for example, 5G frequency bands (e.g., 28 GHz) may be used. That said, the techniques for radar data compression provided herein may be implemented in imaging radar systems using higher and/or lower radio frequency (RF) frequencies (e.g., outside the 30-300 GHz range) depending on desired functionality, manufacturing concerns, and/or other factors.

As noted, imaging radar can generate a large amount of data. Each radar scan can produce radar data in several dimensions, including azimuth, elevation, time, Doppler, and range, for example. CFAR can be used to significantly compressed data by estimating a noise level within the radar data, then removing (compressing) values in the radar data that do not exceed a threshold minimum value above the noise level. Ordered Statistics CFAR (OS-CFAR) uses sorting to get a median value of at least a portion of radar data, and is considered highly effective when compared with Cell-Averaging CFAR (CA-CFAR), which takes the average of pixel values within a defined "cell". However, OS-CFAR implementations can be highly complex, especially one used to process a sliding window of the radar data over multiple dimensions. Peak CFAR involves determining a peak value in one or more dimensions by comparing a value to surrounding values. Problematically, however, peak CFAR does not work well in environments with a relatively large amount of noise. Additionally, regardless of the type of CFAR used, high throughput of imaging radar makes the radar data particularly difficult to compress in software, and traditional hardware implementations are often inflexible and incapable of accommodating changes that may be required by various vendors.

Embodiments described herein address these and other issues by utilizing a two-stage radar compression technique that produces a high degree of compression and may be implemented at least partially in configurable hardware capable of accommodating differences in vendor requirements. An example embodiment is illustrated in FIG. 1.

FIG. 1 is a block diagram illustrating an embodiment of a technique for compressing radar data. As shown, the technique can be divided into a first stage 110 and a second stage 120. The functionality shown in each stage 110, 120 may be executed by hardware and/or software components of a computer system, such as the computer system illustrated in FIG. 10 and described below. This can include, for example, the Segment Routing (SR) flow architecture illustrated in FIG. 7 and/or the Digital Signal Processor (DSP) architecture shown in FIG. 8.

Here, the input samples 130 comprise radar samples from four dimensions: azimuth, elevation, range, and Doppler (which may be abbreviated herein and in the figures as AZ, EL, R, and D, respectively). That is, the input samples 130 comprise a 4D radar image where the "pixel" has a measured value for each azimuth, elevation, range, and Doppler. (As illustrated in FIG. 1, the input samples 130 may comprise the absolute value of the measured value.) Depending on desired functionality, hardware limitations, processing concerns, and/or other factors, the size of each dimension may vary. In the example illustrated in FIG. 1, for example, there are 128 Doppler bins for each azimuth, elevation, and range. (Alternative embodiments may have a larger or smaller amount of values.) The values of the input samples 130 may comprise digital data (e.g., 16-bit or 12-bit values) converted from analog readings by the radar.

Input samples 130 are used for noise estimation in which a median value is calculated for values in at least one dimension of the input samples 130. That is, if a strong target is present, it can be assumed that there will be a single peak in at least one dimension representative of the target, and the rest is noise that can be filtered away. Doppler is the dimension chosen in the example illustrated in FIG. 1, although any dimension may be chosen, depending on desired functionality. That said, using Doppler may be advantageous because noise for the Doppler is primarily due to the crystal, and is relatively uniform compared with noise in other dimensions.

In some embodiments, the first stage 110 may comprise determining the median of more than one dimension. For example, some embodiments may perform a form of double CFAR in which the median determination and with median-based data compression 145 (which is discussed in more detail below) may be performed on a first dimension (e.g., Doppler), and then data may be further compressed by performing similar steps with respect to a second dimension (e.g., azimuth), which would have its own respective threshold. In some embodiments, compression may be performed on additional dimensions in a similar manner. Thus, according to some embodiments, the first stage 110 may include the functions of median determination 135, threshold comparison, and subsequent data compression 145 with respect to more than one dimension.

Although a form of OS-CFAR, the determination of the median here can be done efficiently, because it may deal with a single dimension and does not involve data windowing. (Moreover, for in which medians are determined for multiple dimensions, such embodiments may determine the medians of those respective dimensions one at a time.) As a person of ordinary skill in the art will appreciate, the determination of a median in a one-dimensional array can be done in any variety of ways. As previously mentioned, some embodiments may utilize hardware-based solutions to accommodate the bandwidth required to process the input samples 130.

Figure 2A:
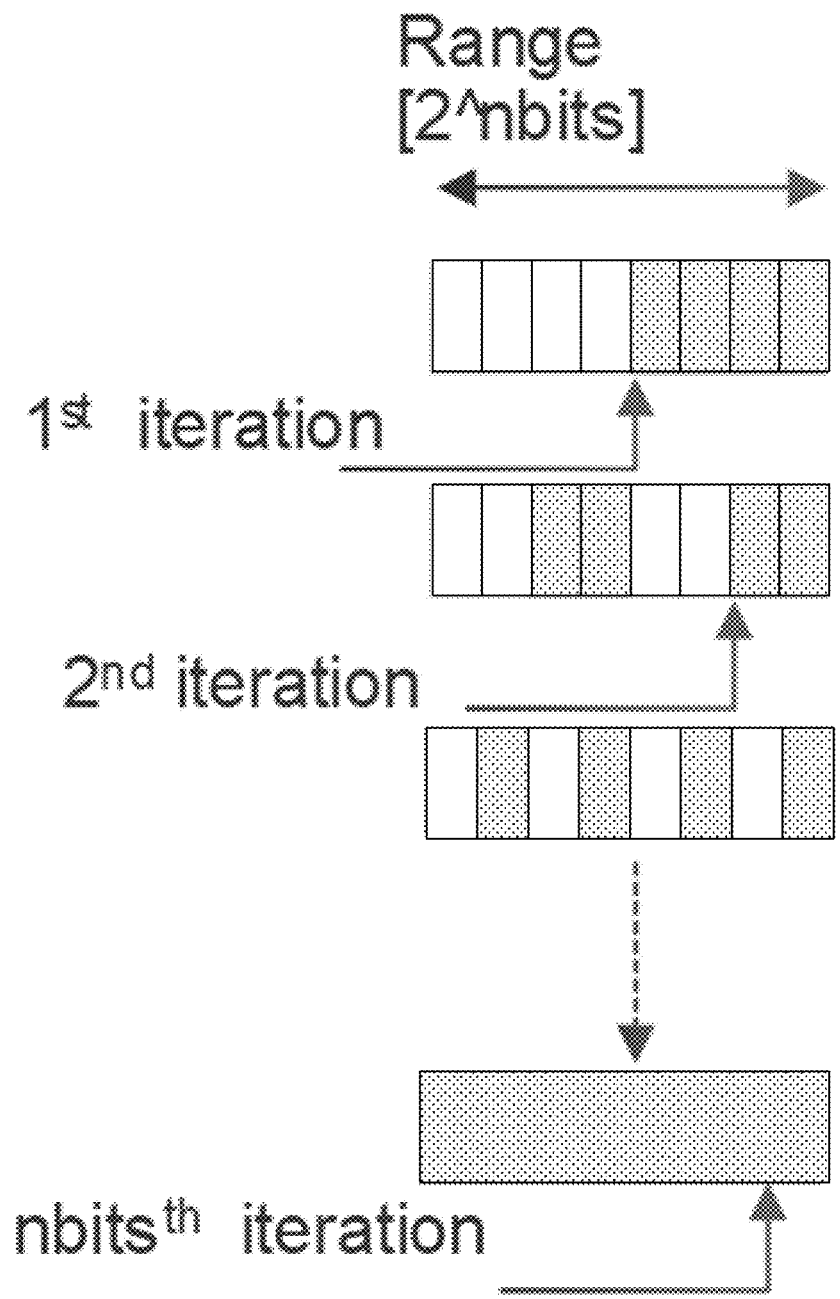
FIG. 2A is a graph illustrating a binary search, used to determine a median for one dimension of the input samples, according to an embodiment.

FIG. 2A is a graph illustrating a binary search, used to determine a median for one dimension of the input samples 130, according to an embodiment. Here, rather than performing a sort, embodiments may utilize a vectorized array of comparators (e.g., 128 comparators) that calculates median value per nbits cycles. All input samples of the dimension may be compared against a threshold, based on the iteration and the number of samples (values) in the array, that provides the cumulative distribution histogram for the one-dimensional array, from which the median can be determined.

As a simple example, for a one dimensional array comprising eight values:

| 1 | 2 | 5 | 67 | 69 | 32 | 1 | 67 | where each value represents a sample of the radar in the dimension for which the median is to be determined (e.g., Doppler), each of which can have a maximum possible value of 128. To get a solution of the order 4 (half the number of values), the array can be subject to an iterative process as shown in table 1.

TABLE 1

Example Binary Search Values

| Iteration | Threshold | # ≥ Threshold |
|---|---|---|
| 1 | 64 | 3 |
| 2 | 32 | 4 |
| 3 | 48 | 3 |
| 4 | 40 | 3 |
| 5 | 36 | 3 |
| 6 | 34 | 3 |
| 7 | 33 | 3 |
| 8 | 32 | 4 |

As can be seen, a threshold of 64 is set for the first iteration (because it is half of the maximum value of 128), and the number of values equal to or greater than 64 is returned (3). With each subsequent iteration, as shown in FIG. 2A, a new threshold is determined based on whether the number of values equal to or greater than the previous threshold, where the new threshold is the old threshold ±half the absolute value of the previous change (e.g., based on the number of values greater or equal to the threshold, the second iteration raises or lowers the threshold by 32, the third iteration raises or lowers by 16, the fourth iteration raises or lowers by 8, etc.). The threshold is lowered if the number of values that meet or exceed the threshold is less than the order number, and raised if the number is greater than or equal to the order number. Thus, as can be seen in table 1, the threshold at each iteration is selected such that the number of values that meet or exceed the threshold converges to the order number 4. The value 32, then, is the median. As a person of ordinary skill in the art will appreciate, a similar process can be used for determining the median of a larger one-dimensional array of values.

Figure 2B:
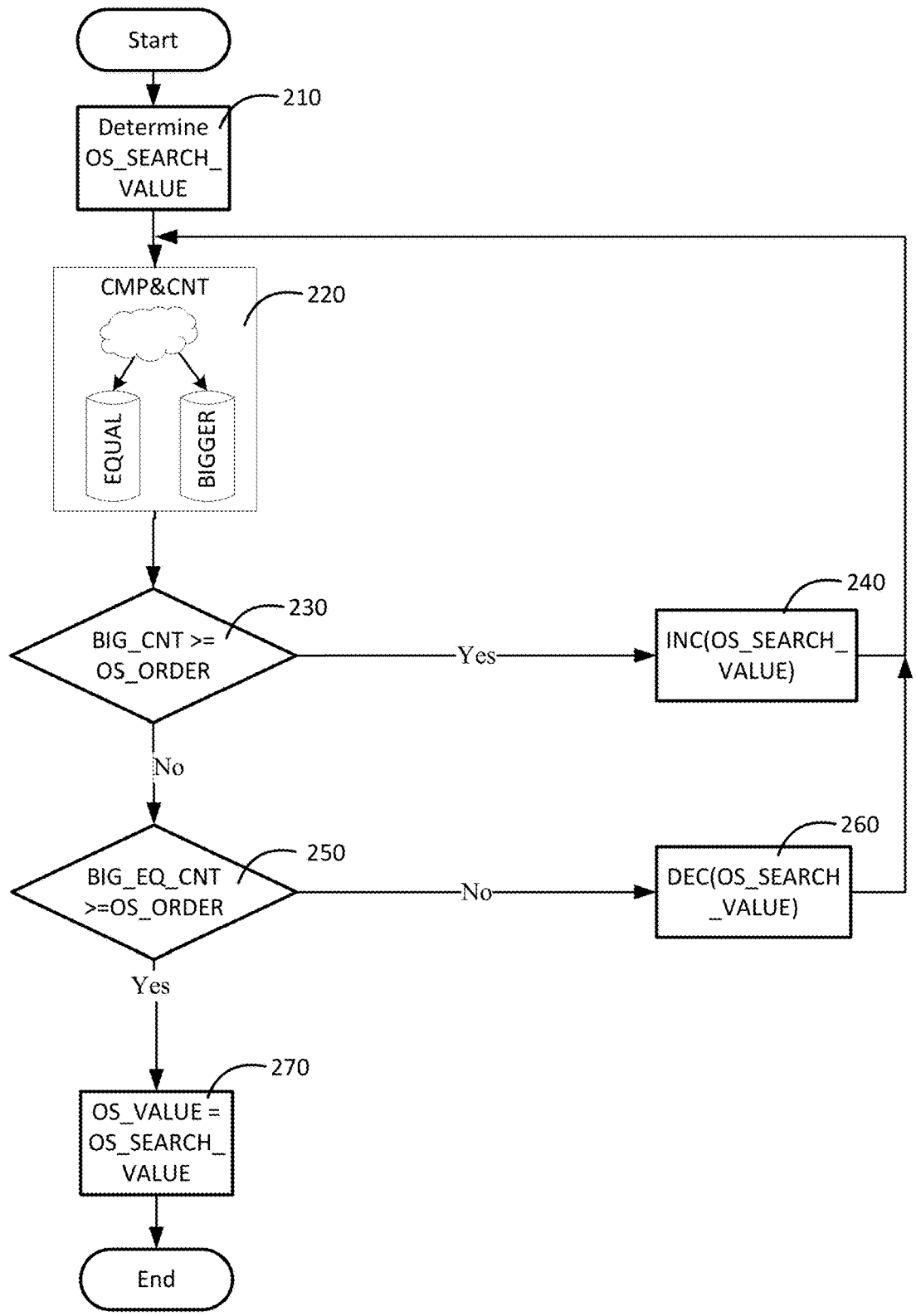
FIG. 2B is a flowchart illustrating a binary search process in a generic form, according to an embodiment.

FIG. 2B is a flowchart illustrating a binary search process in a generic form, according to an embodiment. It will be understood, however, that alternative techniques may be used to perform a binary search to determine the median value of radar samples in a particular dimension. Moreover, in alternative embodiments, some functions may be combined, separated, and/or performed in alternative order, depending on desired functionality.

The functionality of block 210 comprises setting the Ordered Statistic (OS) search value, which may be based on ordered statistics techniques. (In the example above, the OS search value corresponds to the threshold. Initially, this was 64, corresponding to half the maximum possible sample value.) As shown at block 220, each value in the one-dimensional array of radar sample values is compared with the OS search value (e.g., using an array of comparators), to determine the number of samples in the array with values equal to or bigger than the OS search value.

The results are then compared with an OS order to determine whether further processing is needed. Again, the determination of the OS order may be based on ordered statistics techniques. (In the example above, the OS order number was 4, corresponding to half the number of values in the one-dimensional array.) As shown in block 230, if the number of samples with values that are bigger than the OS search value is equal to or larger than the OS order, then the OS search value can be incremented (as shown at block 240), and the comparison at block 220 can be repeated. (The incrementing of the OS search value can be done in a binary search fashion, as shown in FIG. 2A, by incrementing the value to a value at the midpoint between the current OS search value and either the maximum value or a previously-searched OS search value.)

As shown by block 250, if the number of samples with values that are bigger than the OS search value is not equal to or larger than the OS order, the number of samples with values that are equal to the OS search value is compared with the OS order. If the number of samples with values that are equal to the OS search value is not greater than or equal to the OS order, the OS search value can be decremented (as shown at block 260), and the comparison at block 220 can be repeated. (The decrementing of the OS search value, too, can be done in a binary search fashion by reducing the value to a value at the midpoint between either the minimum value or a previously-searched OS search value.)

Finally, as shown at block 270, if the number of samples with values that are equal to the OS search value is greater than or equal to the OS order, then the OS value (the median) is determined to be the current OS search value.

Figure 3A:
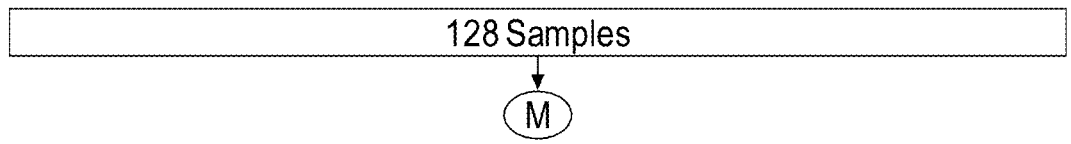
FIGS. 3A-3C are diagrams illustrating how embodiments may allow for splitting of values in a one-dimensional array of values into multiple subsets for localization.
Figure 3B:
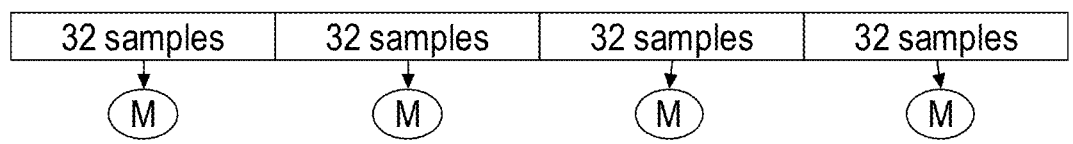
Figure 3C:
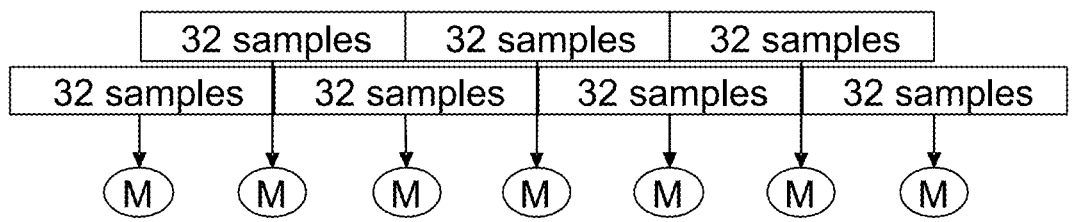

It can be noted that, although some embodiments may utilize a binary search rather than a moving window to calculate the median, some embodiments may allow for splitting the values into multiple subsets for localization. Examples are illustrated in FIGS. 3A-3C. The example illustrated in FIG. 3A assume a one-dimensional array of 128 input samples (values), although alternative embodiments may have a larger or smaller amount of input samples in the one-dimensional array.

FIG. 3A is a diagram showing how a single median value may be calculated from the entire one-dimensional array (e.g., in the manner previously described with regard to FIGS. 2A and 2B), according to an embodiment.

FIG. 3B is a diagram of an alternative embodiment in which the one-dimensional array is split into four subsets. More specifically, the one-dimensional array of 128 samples is split into four equal, mutually-exclusive subsets of 32 samples each. A median can then be calculated for each subset. Each subset may therefore have a different noise estimation, which can be helpful in instances where there may be a relatively large amount of targets within a certain range. (Where Doppler is used, for example, there may be a large amount of targets within a range of speeds.)

FIG. 3C is a diagram of yet another alternative embodiment in which the one-dimensional array is split into seven subsets. Similar to the example in FIG. 3B, subsets again include 32 samples each. Here, however, subsets overlap (e.g., are not mutually exclusive). This can result in an increase in locality from the example illustrated in FIG. 3B. However, because of the overlap in the subsets, median values may result in a more accurate solution than if subsets were smaller (e.g., with little or no overlap).

Figure 4:
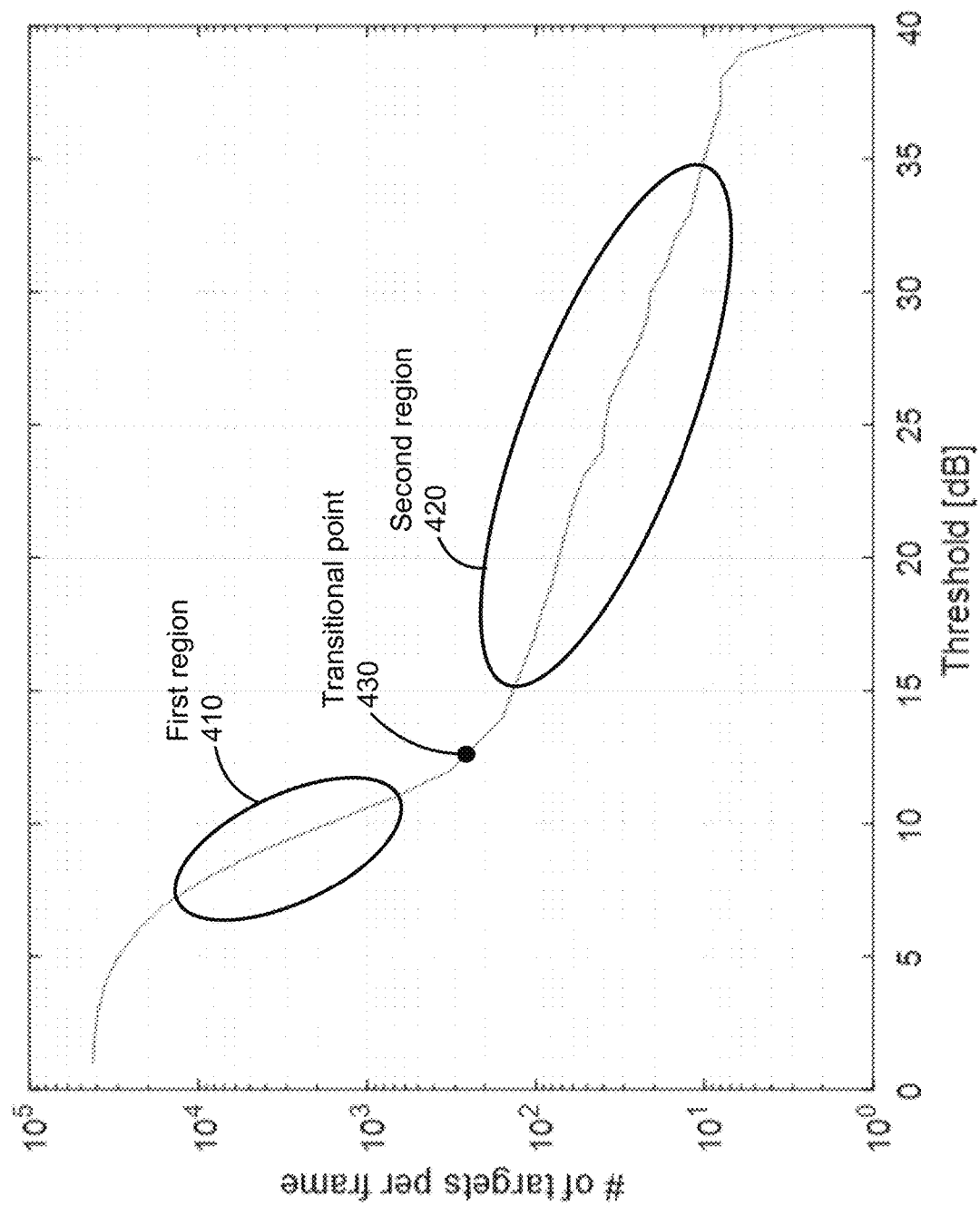
FIG. 4 is an illustration of a graph that can be used for threshold determination, according to some embodiments.

Returning to FIG. 1, once the median determination 135 has been made, a threshold determination 140 is made in which a threshold value is added to the determined median for purposes of compressing the input samples 130 by filtering out values that do not meet the threshold. Put differently, when added to the determined median, the threshold value represents a value that exceeds a noise floor and, if exceeded, represents a detected target. As noted, different threshold values may be determined for and applied to values of input samples 130 in different dimensions. A threshold value may be determined in any of a variety of ways. FIG. 4 helps illustrate one technique for determining a threshold value.

FIG. 4 is an illustration of a graph that can be used for threshold determination, according to some embodiments. Here, the number of targets per frame (verified manually against visible targets) is plotted for various threshold values, in increasing dB. As can be seen, the number of targets is a nonlinear function with two regions of interest. A first region 410 at relatively lower threshold values represents a rapid increase in target detection, and a second region 420 at higher threshold values represents a limited increase in target detection (noise statistics start to dominate). A transitional point 430 can be identified at the approximate boundary between the first region 410 and second region 420. According to some embodiments, the transitional point 430 may represent an optimal threshold. Depending on desired functionality, the threshold can be determined based on the location of the transitional point 430. In some embodiments, for example, the threshold may be selected as being a predetermined amount of dB lower than the transitional point 430, to help ensure targets are not filtered out of the data. In FIG. 4, for example, if the predetermined amount is 3 dB, then the resulting threshold would 10 dB (3 dB lower than the 13 dB transitional point 430).

Returning to FIG. 1, with the threshold value determined, the threshold value can then be added to the determined median to create a threshold map. During data compression 145, input samples 130 for a given dimension can be filtered out if they fail to meet the respective threshold value for that dimension. This can result in a substantial amount of compression. Depending on the threshold and scenario itself, this compression can result in a ratio of 50:1-1500:1.

Figure 5A:
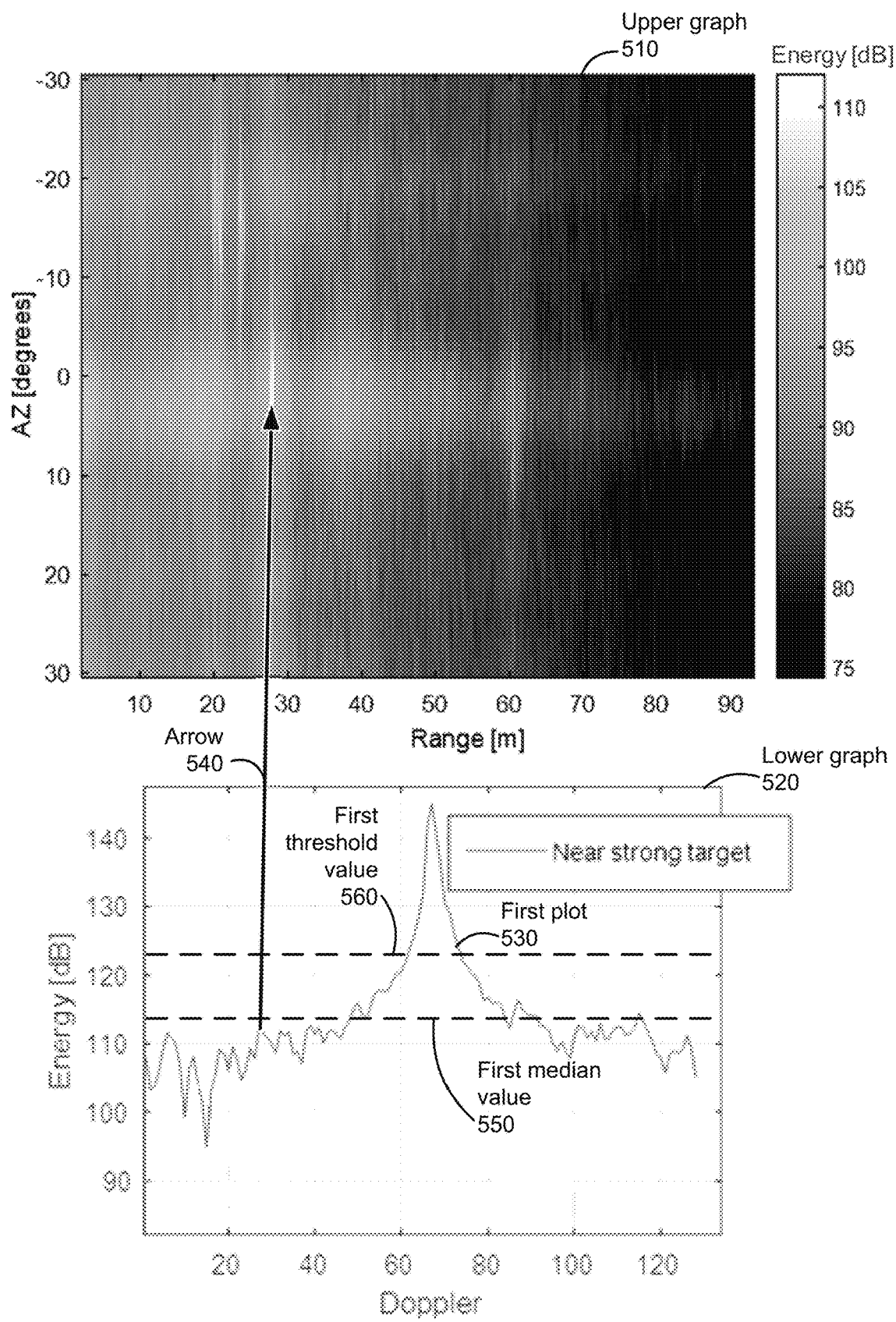
FIGS. 5A and 5B each show two graphs illustrating how the first stage is used to compress data, according to an example.
Figure 5B:
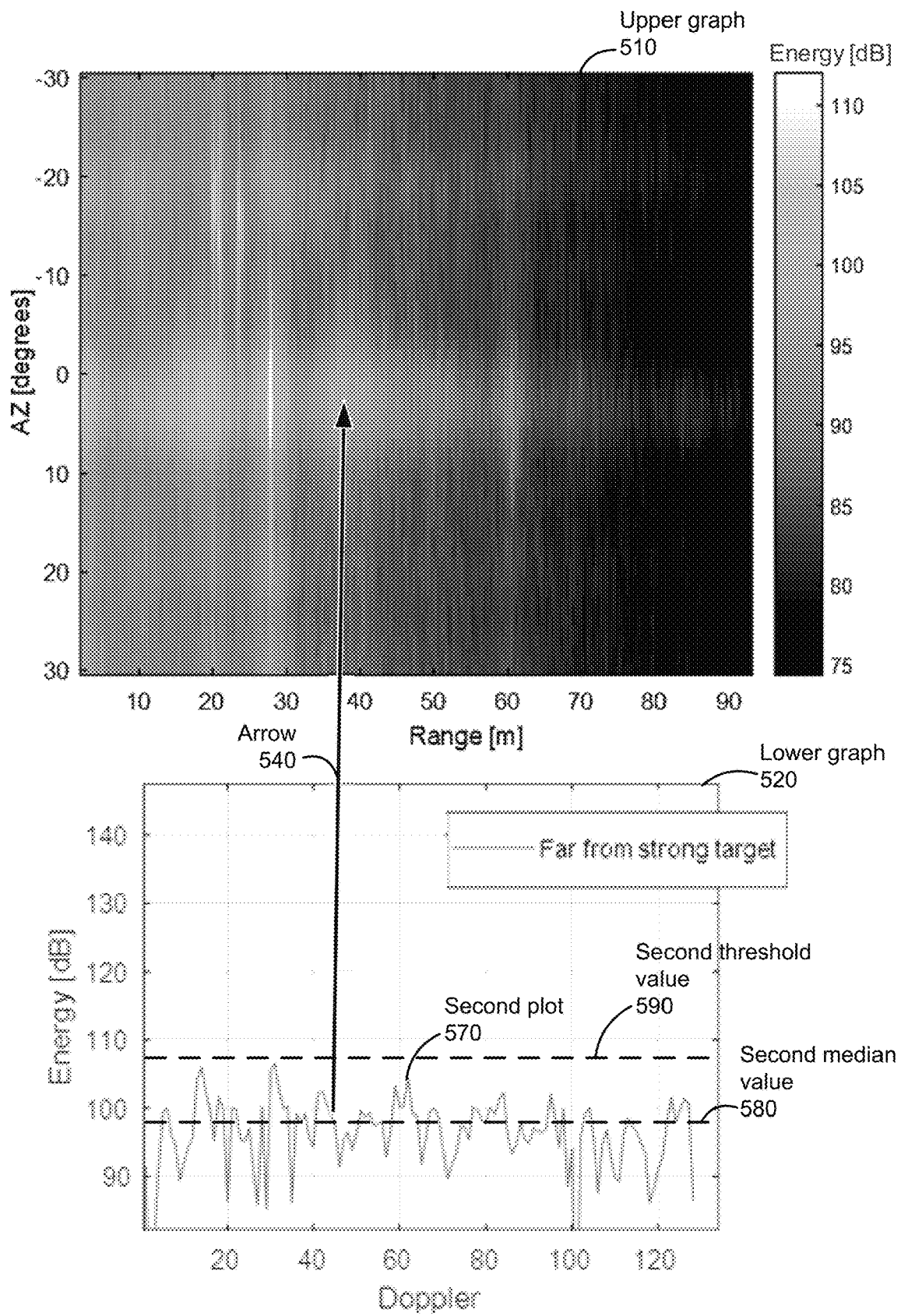

FIGS. 5A and 5B each show two graphs, an upper graph 510 and a lower graph 520, illustrating how the first stage 110 is used to compress data, according to an example. A person of ordinary skill in the art will appreciate, however, that embodiments may utilize different thresholds, and that situations may vary in which multiple targets are identified. Thus, FIGS. 5A and 5B is provided only as a non-limiting example.

In FIG. 5A, the upper graph 510, the median Doppler value is mapped over azimuth and range values. In the lower graph 520, a first plot 530 of Doppler values for a corresponding first point (having a given azimuth and range) on the upper graph 510 near a strong target. (The arrow 540 connects the first plot 530 to the respective first point in the upper graph 510.) As shown by the shading of the first point in the upper graph 510, the median value of the first plot 530 exceeds 110 dB. This first median value 550 is shown in the lower graph 520. Using the techniques described above, a predetermined threshold (approximately 10 dB in the example shown in FIG. 5) may be multiplied with the first median value 550 provide a first threshold value 560 used to filter out data. As can be seen, most data from the first plot 530 can be filtered out. Thus, in the compressed data (the output of the first stage 110 of FIG. 1), only the center peak of the first plot 530 may remain.

A similar process may be used to filter out data from the second plot 570, shown in FIG. 5B. In FIG. 5B, however, the lower graph 520, includes a second plot 570 of Doppler values for a corresponding second point on the upper graph 510 far from the strong target. (Again, the arrow 540 connects the second plot 570 to the respective second point in the upper graph 510.) The median value of the second plot 570 is shown in the lower graph 520 as second median value 580, and a second threshold value 590 of 10 dB higher than the second median value 580 is provided. As can be seen, all data from the second plot 570 can be filtered out.

According to some embodiments, the compressed data output of the first stage 110 (e.g., after filtering input samples 130 using threshold values as shown in FIGS. 5A and 5B) may be stored in a way that allows for efficient data retrieval while maintaining small memory requirements.

Figure 6:
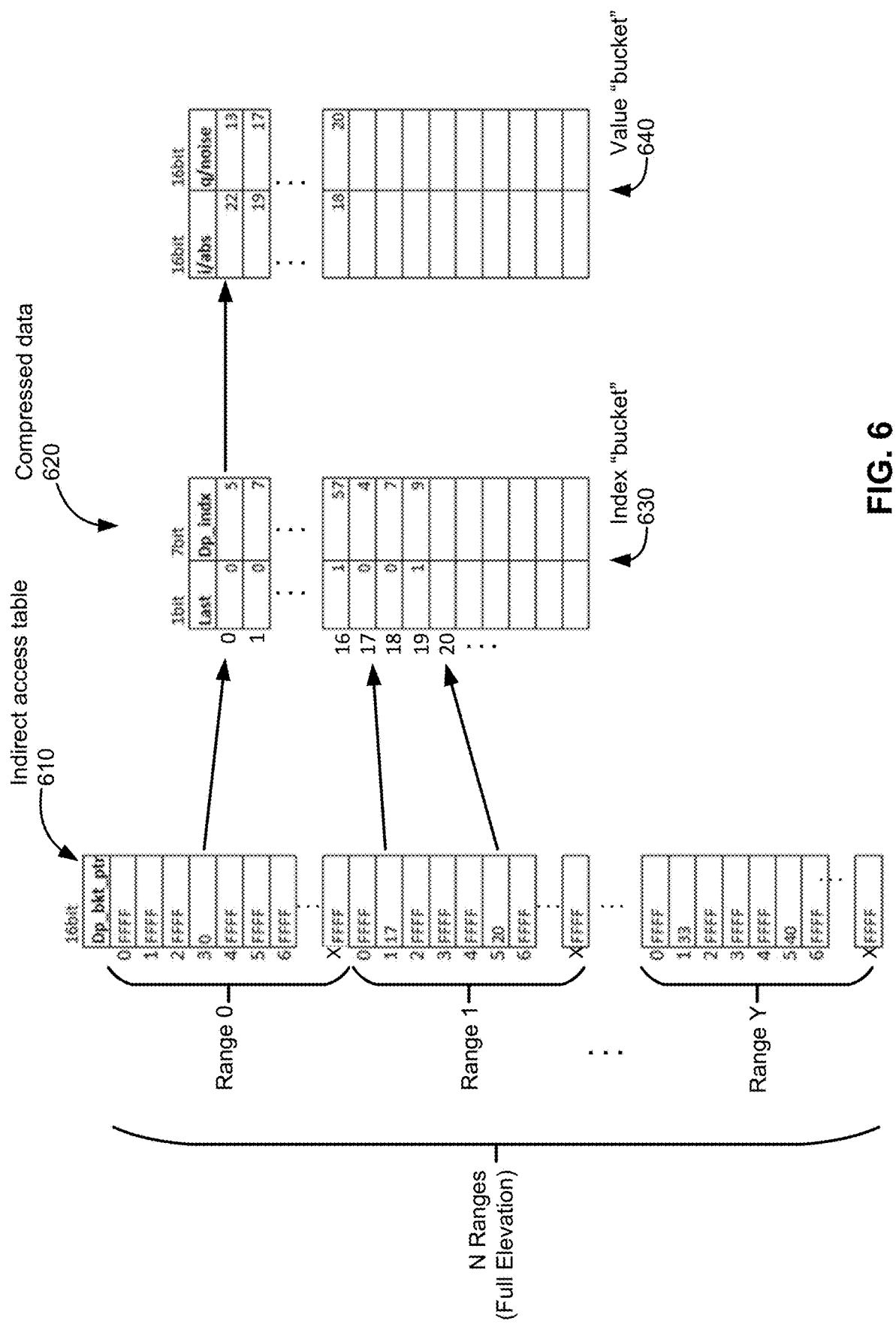
FIG. 6 is an illustration of a data structure that can be used for storage of the compressed data output.

FIG. 6 is an illustration of a data structure that can be used for storage of the compressed data output, according to an embodiment. The data structure comprises an indirect access table 610 (for each elevation) and compressed data 620. This data structure can allow for an exceptionally high access time while maintaining a relatively low memory usage. The example sizes of the various entries in the data storage are indicated at the top of the entries (e.g., "16 bit," "1 bit," "7 bit"), although it can be noted that alternative embodiments may comprise differently-sized entries than those shown in FIG. 6. Moreover, different embodiments may have dimensions of different sizes than those illustrated.

The indirect access table 610 comprises a fixed-sized table with a series of entries for each range and azimuth for a given elevation. (The example indirect access table 610 in FIG. 6, therefore, shows entries for only a single elevation. Other elevations would have respective indirect access tables 610. That said, in some alternative embodiments, a single table may be used for all elevations.) Here, azimuth indices span from 0 to X for each range, representing X+1 azimuths. Range indices span from 0 to Y, representing Y+1 ranges. It will be understood that alternative embodiments may azimuth, range, and elevation entries in a different way.

The indirect access table 610, indicates whether, for each entry, a value over a threshold has been detected. If, for a given range, azimuth, and elevation, Doppler values exceed a threshold, a pointer is used to point to a location in the compressed data 620 having the Doppler data. Otherwise, the indirect access table 610 will include a null value ("FFFF"), rather than a pointer. In the example illustrated in FIG. 6, values in the indirect access table 610 for range 0, azimuth 3; range 1, azimuth 1; and range 1, azimuth 5 have pointer values of 0, 17, and 20, respectively. These are pointer values pointing to a location within the compressed data 620 (illustrated as respective rows). (For simplicity, only a portion of the values in the compressed data 620 are shown. That is, in some instances, each entry will include a value.)

The information in formatting of the compressed data 620 may vary, depending on desired functionality. In some embodiments, the compressed data 620 may include the Doppler indexes where detections (at a given azimuth, range, and elevation) happened, along with detection values. In some embodiments, as illustrated in FIG. 6, software memory access may be simplified by separating the compressed data 620 into two parts: one for indexes (shown in the index "bucket" 630), and one for detected values (shown in the value "bucket" 640). In some embodiments, the compressed data 620 may further include a "last" designation to indicate whether the corresponding Doppler is the last Doppler value detected for a specific elevation, range, and azimuth.

In some embodiments, compressed data 620 may be optimized for parallel access. For example, different portions (e.g., ranges of data) of the compressed data 620 may be stored in different memory banks of a memory block. This can allow for storage to and/or retrieval from data in the compressed data 620 with very small latency and high throughput due to parallelism. In some embodiments, for example, the peak detection 150 performed in the second stage 120 (discussed in more detail below) may be conducted using parallel processes that access multiple memory banks simultaneously. That is, in some embodiments, special machines can operate in parallel and retrieve and decompress the data from compressed memory was very small latency and very high throughput.

Returning again to FIG. 1, the second stage 120 can be performed by performing peak detection 150 on the compressed data 160. Performing peak detection can involve performing 3D or 4D peak detection by determining whether there is a peak value in the compressed data 160 across three or four dimensions. This can mean checking corresponding values and neighboring values across all dimensions. More generally, for a number of dimensions, N, this can involve checking $3^N-1$ points (26 points for 3D peak detection, and 80 points for 4D peak detection). Peaks that are found from the peak detection 150 can be added to a target list, which may be the output of the second stage 120. The determination of whether to conduct 3D or 4D peak detection can be based on preference, and may be a configurable aspect, as discussed in more detail below.

Because peak detection 150 can be performed on compressed data 160 that is efficiently stored, peak detection can be performed quickly. That is, because compressed data 160 may be randomly accessible (e.g., as shown in FIG. 6), identifying and comparing nearby values across three or four dimensions (for 3D or 4D peak detection) may be done faster than if compressed data is stored in raster or other order. Moreover, the peak detection 150 can provide additional compression. The target list, for example, can be 10-40 times smaller than the compressed data 160.

Figure 7:
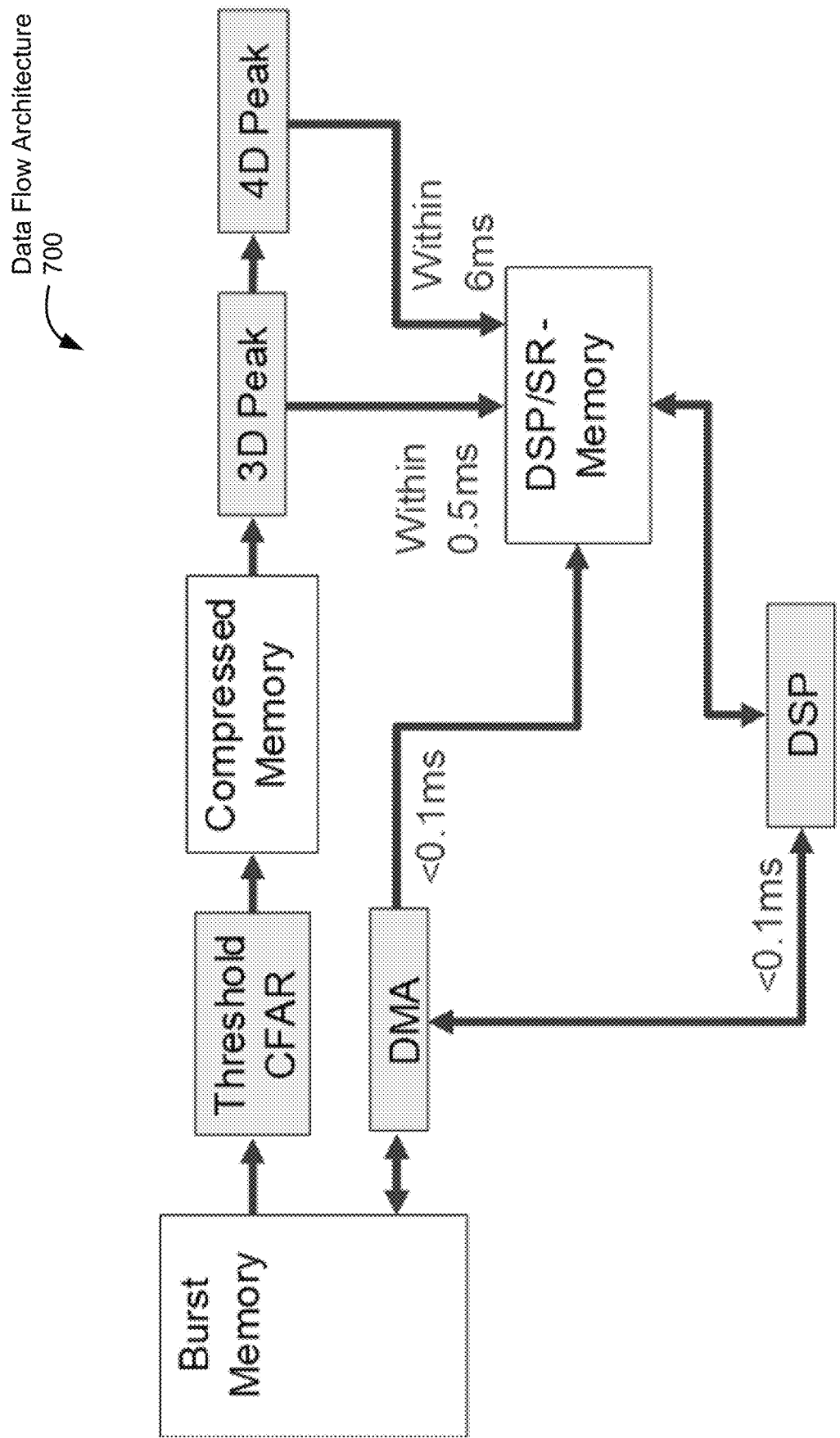
FIG. 7 is an illustration of an example data flow architecture, according to an embodiment.

FIG. 7 is an illustration of an example data flow architecture 700, according to an embodiment. The illustrated block for Threshold CFAR corresponds to functionality of the first stage 110 illustrated in FIG. 1, and illustrated blocks for 3D peak and 4D peak corresponds to functionality of the second stage 120. It will be understood that the time delays shown in FIG. 7 are associated with a particular embodiment, based on hardware utilized. Alternative embodiments may have different delays.

Figure 8:
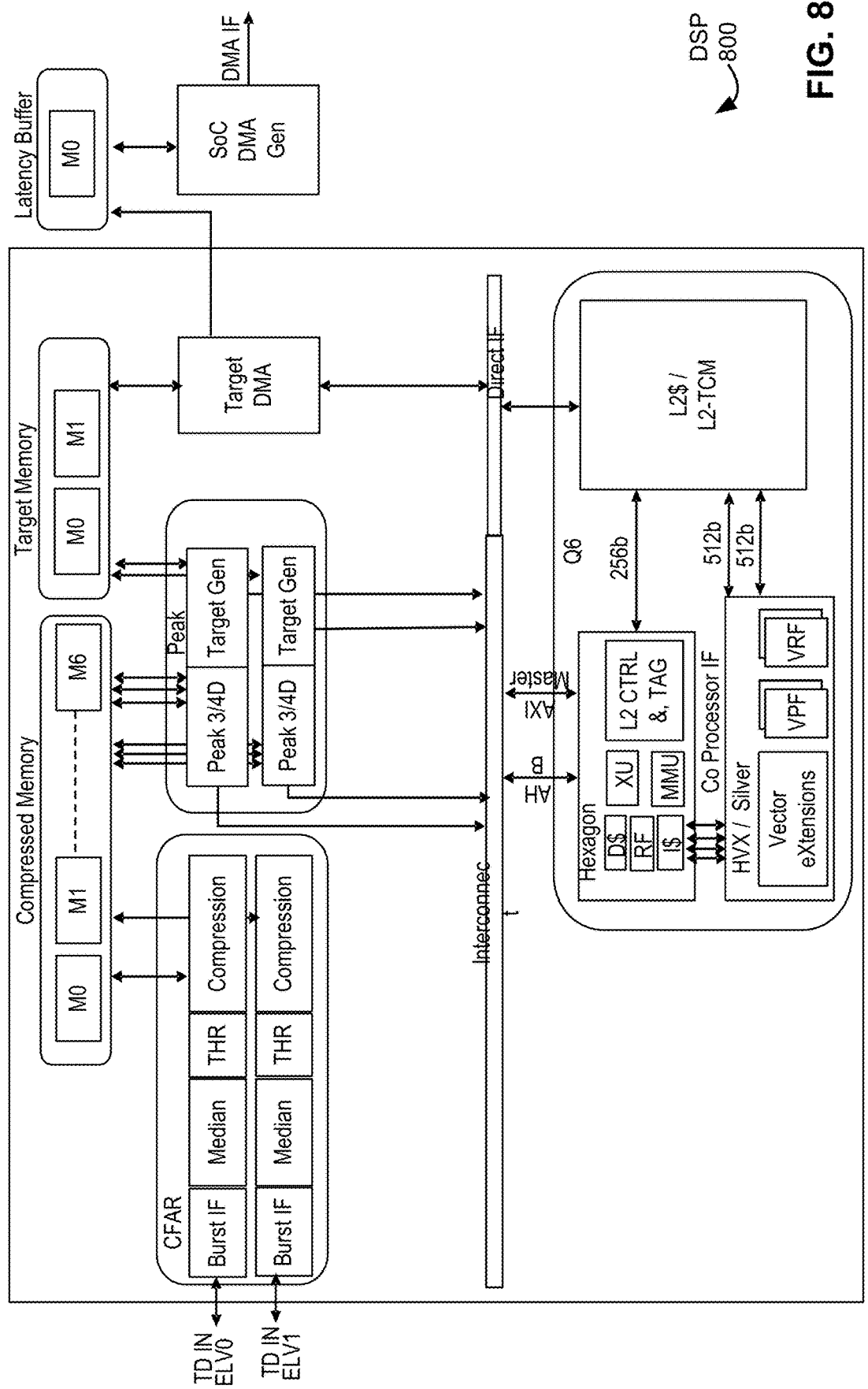
FIG. 8 is an illustration of an example DSP block diagram, according to an embodiment.
Figure 10:
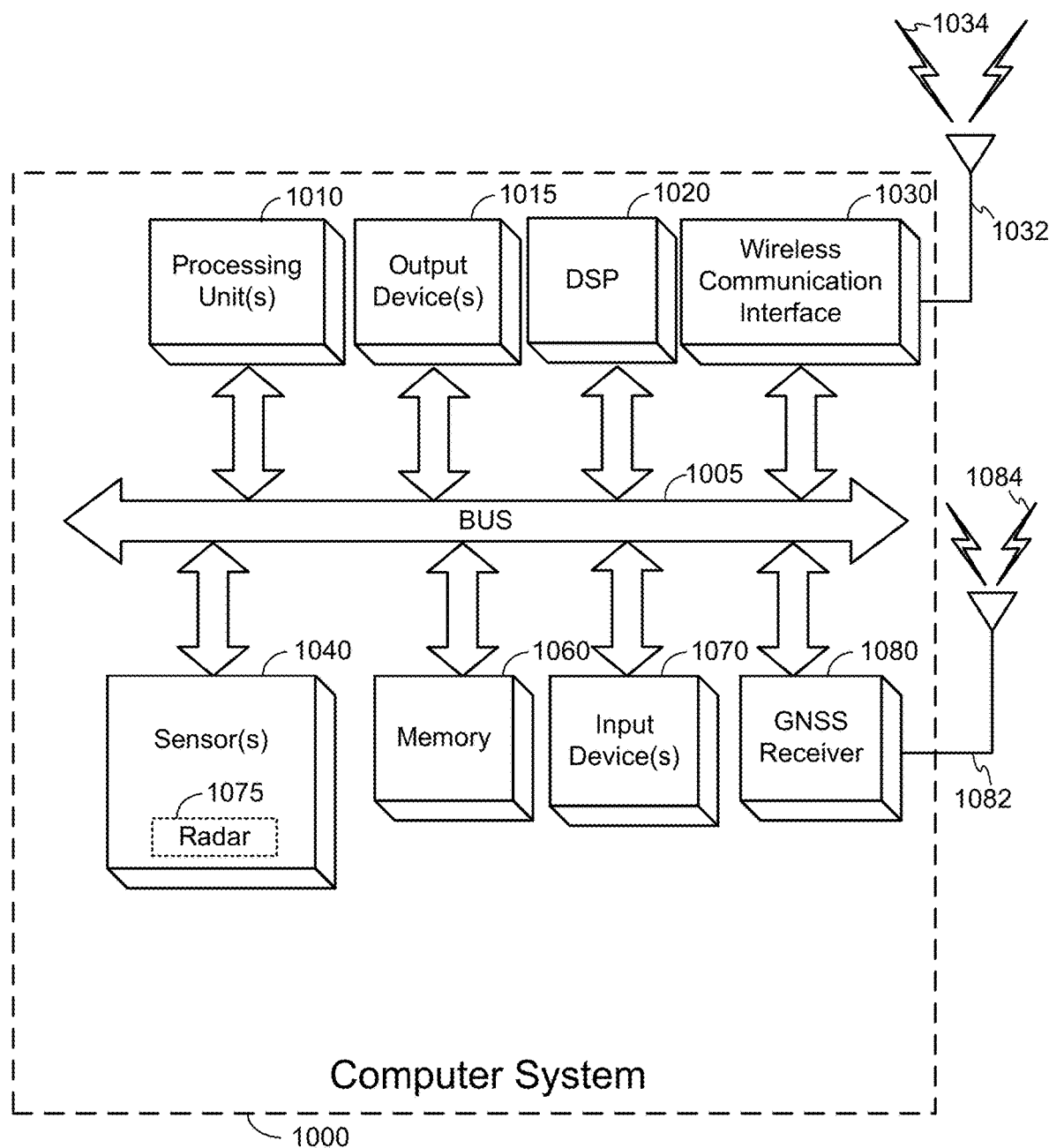
FIG. 10 illustrates an embodiment of a computer system, which may be utilized as described herein.

FIG. 8 is an illustration of an example DSP block diagram, illustrating an embodiment of a DSP 800 that can be used to perform one or more of the functions described herein. Aspects of the various components illustrated in FIG. 8 can be used to perform the techniques for data compression described herein, which can include the data compression and storage taught in the above-described embodiments. The block diagram provided in FIG. 8 is provided only as a non-limiting example. A person of ordinary skill in the art will appreciate that various alterations may be made, while still allowing the DSP to provide the functionality described herein. The DSP 800 may be included in a computer system, as shown in FIG. 10 (item 1020) and described below.

CFAR and peak detection in the manner described herein can be performed by the components within the respective "CFAR" and "Peak" blocks of the DSP 800. The multiple arrows extending from the Peak block to the Compressed Memory block illustrate how a plurality of peak detection engines can work in parallel and access multiple locations and memory at the same time. The peak detection engines may then perform the peak detection (e.g., by making comparisons) on the values accessed. As previously noted, peak detection can be made by comparing values across three or four dimensions.

The peak detection performed by the peak detection engines can be customized in any of a variety of ways, to employ different types of peak detection, depending on desired functionality. For instance, not only may a peak detection engine find a peak among neighboring values, it may be customized to further include a threshold, such that peak values are only identified as peaks if they have a value at least a threshold amount larger than neighboring values. Additionally or alternatively, peak detection engines may be customized to simply identify peaks as values larger than an average value among neighboring values, and/or larger than the average value by at least a threshold amount. In some embodiments, peak control engines may perform the comparison of values utilizing control registers representing values from different dimensions (e.g., different registers for different dimensions), enabling the quick comparison of a given value against a maximum value or average value among neighboring values. In some embodiments, the selection of a threshold value (which may be positive or negative), a math configuration (e.g., comparing against a maximum or average), and/or a size of a region for analysis (e.g., the amount of neighboring values to compare) may be configurable.

Ultimately, the functions described herein may be implemented by hardware and/or software components in any of a variety of ways. Moreover, some embodiments may allow for additional types of configurability in one or more aspects. For example, embodiments may allow for the use of dimensions other than Doppler for median determination and/or determine localized medians (e.g., as illustrated in FIGS. 3A-3C), and/or determination of dimensions for 3D and/or 4D peak detection According to some embodiments, configurations may optionally use a "passing by" threshold (rather than a simple "larger than" comparison) in peak detection.

Figure 9:
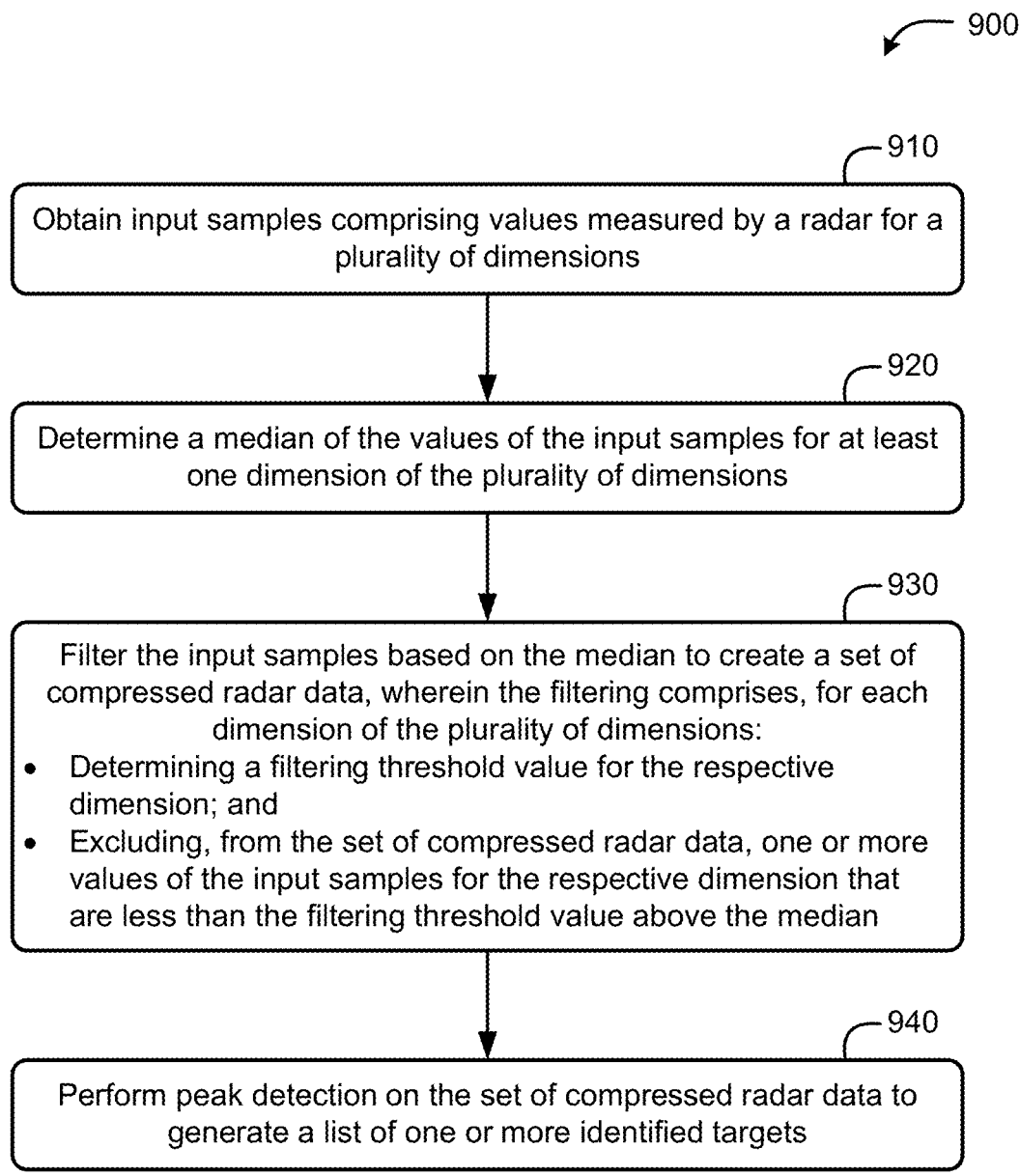
FIG. 9 is a flow diagram of a method of compressing radar data, according to an embodiment.

FIG. 9 is a flow diagram of a method 900 of compressing radar data, according to an embodiment. Alternative embodiments may vary in function by combining, separating, or otherwise varying the functionality described in the blocks illustrated in FIG. 9. Means for performing the functionality of one or more of the blocks illustrated in FIG. 9 may comprise hardware and/or software components of a computer system, such as the computer system 1000 illustrated in FIG. 10 and described in more detail below. As noted, the computer system may comprise one or more components illustrated in FIG. 7 and/or FIG. 8.

At block 910, the functionality comprises obtaining input samples comprising values of radar samples for a plurality of dimensions. As described in the embodiments provided herein, these dimensions may comprise two or more of azimuth, elevation, Doppler, or range. The input samples comprise raw radar data, or we comprise radar data that has been subject to some preliminary processing (e.g., in which absolute values are taken of raw radar data). Means for performing the functionality at block 910 may comprise, for example, a radar 1075, wireless communication interface 1030, and/or other component(s) of a computer system 1000, as illustrated in FIG. 10 and described in more detail below.

At block 920, the median of the values of the input samples for at least one dimension of the plurality of dimensions is determined. As described above in relation to FIG. 2, in some embodiments, determining the median may comprise conducting a binary search using an array of comparators. In some embodiments, this may comprise iteratively comparing the values of input samples with a search value using the array of comparators, and for each iteration: (i) comparing a number of input samples having values greater than the search value with an ordered statistic order, and (ii) changing the search value base on the comparison. Means for performing the functionality at block 920 may comprise, for example, processing unit(s) 1010, DSP 1020, and/or other component(s) of a computer system 1000, as illustrated in FIG. 10 and described in more detail below, which may be used to execute one or more of the components in the CFAR block illustrated in the DSP 800 of FIG. 8.

The functionality at block 930 comprises filtering the input samples based on the median to create a set of compressed radar data, wherein the filtering comprises, for each dimension of the plurality of dimensions, determining a filtering threshold value for the respective dimension, and excluding, from the set of compressed radar data, one or more values of the input samples for the respective dimension that are less than the filtering threshold value above the median. As indicated in the embodiments described above, a filtering threshold value may be set at a predetermined value above the determined median.

As described in FIGS. 3A-3C, multiple medians may be calculated for the dimension by splitting the dimension into subsets. Thus, in some embodiments, determining the median of the values of input samples for the dimension comprises determining a median for each subset of a plurality of subsets within the input samples for the dimension. In such embodiments, for each dimension of the plurality of dimensions determining the filtering threshold value for the respective dimension may comprise determining a plurality of filtering threshold values comprising a filtering threshold value for each subset of the plurality of subsets, and/or excluding the one or more values of the input samples from the set of compressed radar data for the respective dimension comprises excluding one or more values of the input samples that are less than at least one filtering threshold value of the plurality of filtering threshold values. In some embodiments (as shown in FIG. 3B) the plurality of subsets within the input samples for the dimension are mutually exclusive. However, as noted, the plurality of subsets within the input samples for the dimension may not be mutually exclusive in some embodiments.

Means for performing the functionality at block 930 may comprise, for example, processing unit(s) 1010, DSP 1020, and/or other component(s) of a computer system 1000, as illustrated in FIG. 10 and described in more detail below, which may be used to execute one or more of the components in the CFAR block illustrated in the DSP 800 of FIG. 8.

At block 940, the functionality comprises performing peak detection on the set of compressed radar data to generate a list of one or more identified targets. The compressed radar data may be stored in a special memory that may be randomly-accessible via indirect access tables (as illustrated in FIG. 6). Moreover, according to some embodiments, the compressed data may be distributed among memory banks of the memory such that different portions of the compressed data are accessible simultaneously, which can increase throughput when writing to and/or reading from the compressed data. Depending on desired functionality, 3D and/or 4D peak detection may be performed on the compressed data. Thus, according to some embodiments, the plurality of dimensions may comprise four dimensions, and performing peak detection on the set of compressed radar data comprises identifying a peak value in at least three dimensions of the plurality of dimensions. Means for performing the functionality at block 920 may comprise, for example, processing unit(s) 1010, DSP 1020, and/or other component(s) of a computer system 1000, as illustrated in FIG. 10 and described in more detail below, which again may be used to execute one or more of the components in the CFAR block illustrated in the DSP 800 of FIG. 8.

FIG. 10 illustrates an embodiment of a computer system 1000, which may be utilized as described herein above. For example, the computer system 1000 may comprise a computer system incorporated into a vehicle and used to manage one or more systems related to the vehicle's navigation and/or automated driving, as well as communicate with other on-board systems and/or other traffic entities. The computer system 1000 may be used gather radar data, and may therefore perform one or more of the functions of method 900 of FIG. 9. It should be noted that FIG. 10 is meant only to provide a generalized illustration of various components, any or all of which may be utilized as appropriate. It can be noted that, in some instances, components illustrated by FIG. 10 can be localized to a single physical device and/or distributed among various networked devices, which may be disposed at different physical locations on a vehicle. That said, embodiments are not limited to vehicles and may comprise a computer system 1000 incorporated into a non-vehicular static or mobile device.

The computer system 1000 is shown comprising hardware elements that can be electrically coupled via a bus 1005 (or may otherwise be in communication, as appropriate). The hardware elements may include a processing unit(s) 1010 which can include without limitation one or more general-purpose processors, one or more special-purpose processors (such as DSP, graphics acceleration processors, application specific integrated circuits (ASICs), and/or the like), and/or other processing structure or means. As shown in FIG. 10, some embodiments may have a separate DSP 1020, depending on desired functionality. The DSP 1020 and/or processing unit(s) 1010 may comprise the DSP illustrated in FIG. 8 and/or perform the functionality described in relation to FIG. 8. The computer system 1000 also can include one or more input devices 1070, which can include devices related to user interface (e.g., a touch screen, touch pad, microphone, button(s), dial(s), switch(es), and/or the like) and/or devices related to navigation, automated driving, and the like. Similarly, the one or more output devices 1015 may be related to interacting with a user (e.g., via a display, light emitting diode(s) (LED(s)), speaker(s), etc.), and/or devices related to navigation, automated driving, and the like.

The computer system 1000 may also include a wireless communication interface 1030, which may comprise without limitation a modem, a network card, an infrared communication device, a wireless communication device, and/or a chipset (such as a Bluetooth® device, an IEEE 802.11 device, an IEEE 802.15.4 device, a Wi-Fi device, a WiMAX device, a WAN device and/or various cellular devices, etc.), and/or the like, which may enable the computer system 1000 to communicate with other devices via any of a variety of communication standards. The communication can be carried out via one or more wireless communication antenna(s) 1032 that send and/or receive wireless signals 1034. In some embodiments, the wireless communication interface 1030 may comprise a radar system. And thus, the wireless communication interface 1030 may be configured to not only be used for RF communications, but also for imaging as described in embodiments herein. To do so, the wireless communication interface 1030 may comprise separate transceivers and/or separate receivers and transmitters, or any combination of transceivers, transmitters, and receivers capable of transmitting and receiving RF signals for radar functionality. As such, the antenna 1032 may comprise a plurality of discrete antennas, antenna rays, or any combination.

The computer system 1000 can further include sensor(s) 1040. In some embodiments, the sensor(s) 1040 may comprise a radar system 1075 as described in the embodiments detailed herein. Here, the radar 1075 may be external to or integrated into the computer system 1000, and may include one or more antennas for transmitting and/or receiving the radar RF signals. Additionally or alternatively, as noted, a radar may be incorporated into the wireless communication interface 1030.

Additionally or alternatively, sensor(s) 1040 may comprise, without limitation, one or more accelerometers, gyroscopes, cameras, magnetometers, altimeters, microphones, proximity sensors, light sensors, barometers, LIDARs, and the like.

Embodiments of the computer system 1000 may also include a Global Navigation Satellite System (GNSS) receiver 1080 capable of receiving signals 1084 from one or more GNSS satellites using an antenna 1082 (which could be the same as antenna 1032). Positioning based on GNSS signal measurement can be utilized in conjunction with imaging radar to provide higher-order functionality, including sophisticated navigation and location determination. The GNSS receiver 1080 can extract a position of the computer system 1000, using conventional techniques, from GNSS satellites of a GNSS system, such as Global Positioning System (GPS) and/or similar systems.

The computer system 1000 may further include and/or be in communication with a memory 1060. The memory 1060 can include, without limitation, local and/or network accessible storage, a disk drive, a drive array, an optical storage device, a solid-state storage device, such as a random access memory (RAM), and/or a read-only memory (ROM), which can be programmable, flash-updateable, and/or the like. Such storage devices may be configured to implement any appropriate data stores, including without limitation, various file systems, database structures, and/or the like. In some embodiments, the memory 1060 may comprise one or more memory banks in which compressed data and/or the target list (e.g., as shown in FIG. 1) are stored. Alternatively, those memory banks may be incorporated into the DSP 1020 and/or processing unit(s) 1010.

The memory 1060 of the computer system 1000 also can comprise software elements (not shown in FIG. 10), including an operating system, device drivers, executable libraries, and/or other code, such as one or more application programs, which may comprise computer programs provided by various embodiments, and/or may be designed to implement methods, and/or configure systems, provided by other embodiments, as described herein. Merely by way of example, one or more procedures described with respect to the method(s) discussed above may be implemented as code and/or instructions in memory 1060 that are executable by the computer system 1000 (and/or processing unit(s) 1010 or DSP 1020 within computer system 1000). In an aspect, then, such code and/or instructions can be used to configure and/or adapt a general purpose computer (or other device) to perform one or more operations in accordance with the described methods.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including but not limited to, non-volatile media, volatile media, and transmission media. Common forms of computer-readable media include, for example, magnetic and/or optical media, any other physical medium with patterns of holes, a RAM, a programmable ROM (PROM), erasable PROM (EPROM), a FLASH-EPROM, any other memory chip or cartridge, a carrier wave as described hereinafter, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus, many of the elements are examples that do not limit the scope of the disclosure to those specific examples.

It has proven convenient at times, principally for reasons of common usage, to refer to such signals as bits, information, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this Specification discussions utilizing terms such as "processing," "computing," "calculating," "determining," "ascertaining," "identifying," "associating," "measuring," "performing," or the like refer to actions or processes of a specific apparatus, such as a special purpose computer or a similar special purpose electronic computing device. In the context of this Specification, therefore, a special purpose computer or a similar special purpose electronic computing device is capable of manipulating or transforming signals, typically represented as physical electronic, electrical, or magnetic quantities within memories, registers, or other information storage devices, transmission devices, or display devices of the special purpose computer or similar special purpose electronic computing device.

Terms, "and" and "or" as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AA, AAB, AABBCCC, etc.

Having described several embodiments, various modifications, alternative constructions, and equivalents may be used without departing from the spirit of the disclosure. For example, the above elements may merely be a component of a larger system, wherein other rules may take precedence over or otherwise modify the application of the various embodiments. Also, a number of steps may be undertaken before, during, or after the above elements are considered. Accordingly, the above description does not limit the scope of the disclosure.

What is claimed is:

1. A method of compressing radar data, the method comprising:
    obtaining input samples comprising values measured by a radar for a plurality of dimensions;
    determining a median of the values of the input samples for at least one dimension of the plurality of dimensions;
    filtering the input samples based on the median to create a set of compressed radar data, wherein the filtering comprises, for each dimension of the plurality of dimensions:
        determining a filtering threshold value for the respective dimension; and
        excluding, from the set of compressed radar data, one or more values of the input samples for the respective dimension that are less than the filtering threshold value above the median; and
    performing peak detection on the set of compressed radar data to generate a list of one or more identified targets.

2. The method of claim 1, wherein the plurality of dimensions comprise two or more of:
    azimuth,
    elevation,
    Doppler, or
    range.

3. The method of claim 1, wherein:
    determining the median of the values of the input samples for the at least one dimension comprises determining a median for each subset of a plurality of subsets within the input samples for the at least one dimension; and
    for each dimension of the plurality of dimensions:
        determining the filtering threshold value for the respective dimension comprises determining a plurality of filtering threshold values comprising a filtering threshold value for each subset of the plurality of subsets; and
        excluding the one or more values of the input samples from the set of compressed radar data for the respective dimension comprises excluding one or more values of the input samples that are less than at least one filtering threshold value of the plurality of filtering threshold values.

4. The method of claim 3, wherein the plurality of subsets within the input samples for at least one dimension are mutually exclusive.

5. The method of claim 1, further comprising storing the set of compressed radar data on a plurality of memory banks, wherein at least two memory banks of the plurality of memory banks may be accessed in parallel.

6. The method of claim 1, further comprising storing the set of compressed radar data in a memory bank accessible via one or more indirect access tables.

7. The method of claim 1, wherein determining the median comprises conducting a binary search using an array of comparators.

8. The method of claim 7, wherein conducting the binary search using an array of comparators comprises:
    iteratively comparing the values of input samples with a search value using the array of comparators; and
    for each iteration:
        comparing a number of input samples having values greater than the search value with an ordered statistic order, and
        changing the search value base on the comparison.

9. The method of claim 1, wherein:
    the plurality of dimensions comprises four dimensions; and
    performing peak detection on the set of compressed radar data comprises identifying a peak value in at least three dimensions of the plurality of dimensions.

10. A device for compressing radar data, the device comprising:
    a memory; and
    one or more processing units communicatively coupled with the memory and configured to:
        obtain input samples comprising values measured by a radar for a plurality of dimensions;
        determine a median of the values of the input samples for at least one dimension of the plurality of dimensions;
        filter the input samples based on the median to create a set of compressed radar data, wherein the filtering comprises, for each dimension of the plurality of dimensions:
            determining a filtering threshold value for the respective dimension; and
            excluding, from the set of compressed radar data, one or more values of the input samples for the respective dimension that are less than the filtering threshold value above the median; and
        perform peak detection on the set of compressed radar data to generate a list of one or more identified targets.

11. The device of claim 10, wherein the plurality of dimensions comprise two or more of:
    azimuth,
    elevation, Doppler, or range.

12. The device of claim 10, wherein the one or more processing units are configured to:
   determine the median of the values of the input samples for the at least one dimension least in part by determining of a median for each subset of a plurality of subsets within the input samples for the at least one dimension; and
   for each dimension of the plurality of dimensions:
      determine the filtering threshold value for the respective dimension at least in part by determining of a plurality of filtering threshold values comprising a filtering threshold value for each subset of the plurality of subsets;
      exclude the one or more values of the input samples from the set of compressed radar data for the respective dimension least in part by excluding one or more values of the input samples that are less than at least one filtering threshold value of the plurality of filtering threshold values.

13. The device of claim 12, wherein the plurality of subsets within the input samples for at least one dimension are mutually exclusive.

14. The device of claim 10, wherein the one or more processing units are configured to store the set of compressed radar data on a plurality of memory banks, wherein at least two memory banks of the plurality of memory banks may be accessed in parallel.

15. The device of claim 10, wherein the one or more processing units are configured to store the set of compressed radar data in a memory bank accessible via one or more indirect access tables.

16. The device of claim 10, wherein the one or more processing units are configured to determine the median based on a result of a binary search conducted by an array of comparators.

17. The device of claim 16, wherein the device is configured to conduct the binary search using an array of comparators to:
   iteratively compare the values of input samples with a search value using the array of comparators; and
   for each iteration:
      compare a number of input samples having values greater than the search value with an ordered statistic order, and
      change the search value base on the comparison.

18. The device of claim 10, wherein:
   the plurality of dimensions comprises four dimensions; and
   the one or more processing units are configured to perform peak detection on the set of compressed radar data based on identifying a peak value in at least three dimensions of the plurality of dimensions.

19. A device comprising:
   means for obtaining input samples comprising values measured by a radar for a plurality of dimensions;
   means for determining a median of the values of the input samples for at least one dimension of the plurality of dimensions;
   means for filtering the input samples based on the median to create a set of compressed radar data, wherein the filtering comprises, for each dimension of the plurality of dimensions:
      determining a filtering threshold value for the respective dimension; and
      excluding, from the set of compressed radar data, one or more values of the input samples for the respective dimension that are less than the filtering threshold value above the median; and
   means for performing peak detection on the set of compressed radar data to generate a list of one or more identified targets.

20. The device of claim 19, wherein the plurality of dimensions comprise two or more of:
   azimuth,
   elevation,
   Doppler, or
   range.

21. The device of claim 19, wherein:
   the means for determining the median of the values of the input samples for the at least one dimension comprise means for determining a median for each subset of a plurality of subsets within the input samples for the at least one dimension; and
   means for, for each dimension of the plurality of dimensions:
      determining the filtering threshold value for the respective dimension based on a determination of a plurality of filtering threshold values comprising a filtering threshold value for each subset of the plurality of subsets;
      excluding the one or more values of the input samples from the set of compressed radar data for the respective dimension based on an exclusion of one or more values of the input samples that are less than at least one filtering threshold value of the plurality of filtering threshold values.

22. The device of claim 21, wherein the plurality of subsets within the input samples for at least one dimension are mutually exclusive.

23. The device of claim 19, further comprising means for storing the set of compressed radar data on a plurality of memory banks, wherein at least two memory banks of the plurality of memory banks may be accessed in parallel.

24. The device of claim 19, further comprising means for storing the set of compressed radar data in a memory bank accessible via one or more indirect access tables.

25. The device of claim 19, wherein:
   the plurality of dimensions comprises four dimensions; and
   performing peak detection on the set of compressed radar data comprises identifying a peak value in at least three dimensions of the plurality of dimensions.

26. A non-transitory computer-readable medium having instructions embedded therewith for compressing radar data, wherein the instructions, when executed by one or more processing units, cause the one or more processing units to perform one or more operations comprising:
   obtaining input samples comprising values measured by a radar for a plurality of dimensions;
   determining a median of the values of the input samples for at least one dimension of the plurality of dimensions;
   filtering the input samples based on the median to create a set of compressed radar data, wherein the filtering comprises, for each dimension of the plurality of dimensions:
      determining a filtering threshold value for the respective dimension; and
      excluding, from the set of compressed radar data, one or more values of the input samples for the respective dimension that are less than the filtering threshold value above the median; and performing peak detection on the set of compressed radar data to generate a list of one or more identified targets.

27. The non-transitory computer-readable medium of claim 26, wherein the plurality of dimensions comprise two or more of:
azimuth,
elevation,
Doppler, or
range.

28. The non-transitory computer-readable medium of claim 26, wherein:
determining the median of the values of the input samples for the at least one dimension comprises determining a median for each subset of a plurality of subsets within the input samples for the at least one dimension; and
for each dimension of the plurality of dimensions:
determining the filtering threshold value for the respective dimension comprises determining a plurality of filtering threshold values comprising a filtering threshold value for each subset of the plurality of subsets;
excluding the one or more values of the input samples from the set of compressed radar data for the respective dimension comprises excluding one or more values of the input samples that are less than at least one filtering threshold value of the plurality of filtering threshold values.

29. The non-transitory computer-readable medium of claim 26, wherein the instructions, when executed by one or more processing units, further cause the one or more processing units to perform one or more operations comprising storing the set of compressed radar data on a plurality of memory banks, wherein at least two memory banks of the plurality of memory banks may be accessed in parallel.

30. The non-transitory computer-readable medium of claim 26, wherein the instructions, w when executed by one or more processing units, further cause the one or more processing units to perform one or more operations comprising storing the set of compressed radar data in a memory bank accessible via one or more indirect access tables.

\* \* \* \* \*